(12) United States Patent
Shimanouchi (10) Patent No.: US 7,615,990 B1
(45) Date of Patent: Nov. 10, 2009

(54) LOADBOARD ENHANCEMENTS FOR AUTOMATED TEST EQUIPMENT

(75) Inventor: Masashi Shimanouchi, San Jose, CA (US)

(73) Assignee: Credence Systems Corporation, Milpitas, CA (US)

( * ) Notice: Subject to any disclaimer, the term of this patent is extended or adjusted under 35 U.S.C. 154(b) by 134 days.

(21) Appl. No.: 11/824,333

(22) Filed: Jun. 28, 2007

(51) Int. Cl.
*G01R 31/02* (2006.01)
(52) U.S. Cl. .................. 324/158.1; 324/73.1
(58) Field of Classification Search ............ None
See application file for complete search history.

(56) References Cited

U.S. PATENT DOCUMENTS

| | | | |
|---|---|---|---|
| 4,516,071 A | * | 5/1985 | Buehler ................ 324/765 |
| 4,594,677 A | | 6/1986 | Barlow |
| 4,984,161 A | | 1/1991 | Nakazawa et al. |
| 5,543,728 A | * | 8/1996 | Grace et al. ............ 324/763 |
| 5,784,299 A | | 7/1998 | Evers et al. |
| 6,327,678 B1 | | 12/2001 | Nagai |
| 6,446,228 B1 | | 9/2002 | Kobayashi |
| 6,532,561 B1 | | 3/2003 | Turnquist et al. |
| 6,557,128 B1 | | 4/2003 | Turnquist |
| 6,557,133 B1 | | 4/2003 | Gomes |
| 6,587,811 B2 | | 7/2003 | Schleifer et al. |
| 6,859,902 B1 | | 2/2005 | Dalal et al. |
| 7,120,840 B1 | | 10/2006 | Shimanouchi |
| 2004/0034838 A1 | | 2/2004 | Liau |

* cited by examiner

*Primary Examiner*—Minh N Tang (57) ABSTRACT

An enhanced loadboard and method for enhanced automated test equipment (ATE) signaling. More specifically, embodiments provide an effective mechanism for reducing signal degradation and error interjection by replacing one or more relays with signal splitters for directing signals between one or more pins of a coupled ATE instrument, where the signal splitters reduce loadboard size and operating cost.

24 Claims, 7 Drawing Sheets

LOADBOARD ENHANCEMENTS FOR AUTOMATED TEST EQUIPMENT

BACKGROUND OF THE INVENTION

Loadboards are often used to calibrate and perform diagnostic tests on instruments used in automated test equipment (ATE). For example, a single loadboard coupled to an instrument may couple pins of the instrument for pin-to-pin calibration and diagnostics, whereas multiple loadboards may be coupled to couple pins of multiple instruments for instrument-to-instrument calibration and diagnostics. Given that modern integrated circuits utilize high speed signaling upwards of many gigahertz, loadboard coupled to instruments testing such high-speed devices under test (DUTs) must be able to conduct the high-speed signals with minimal signal degradation such that accurate and precise calibration and/or diagnostics may be performed.

Figure 1:
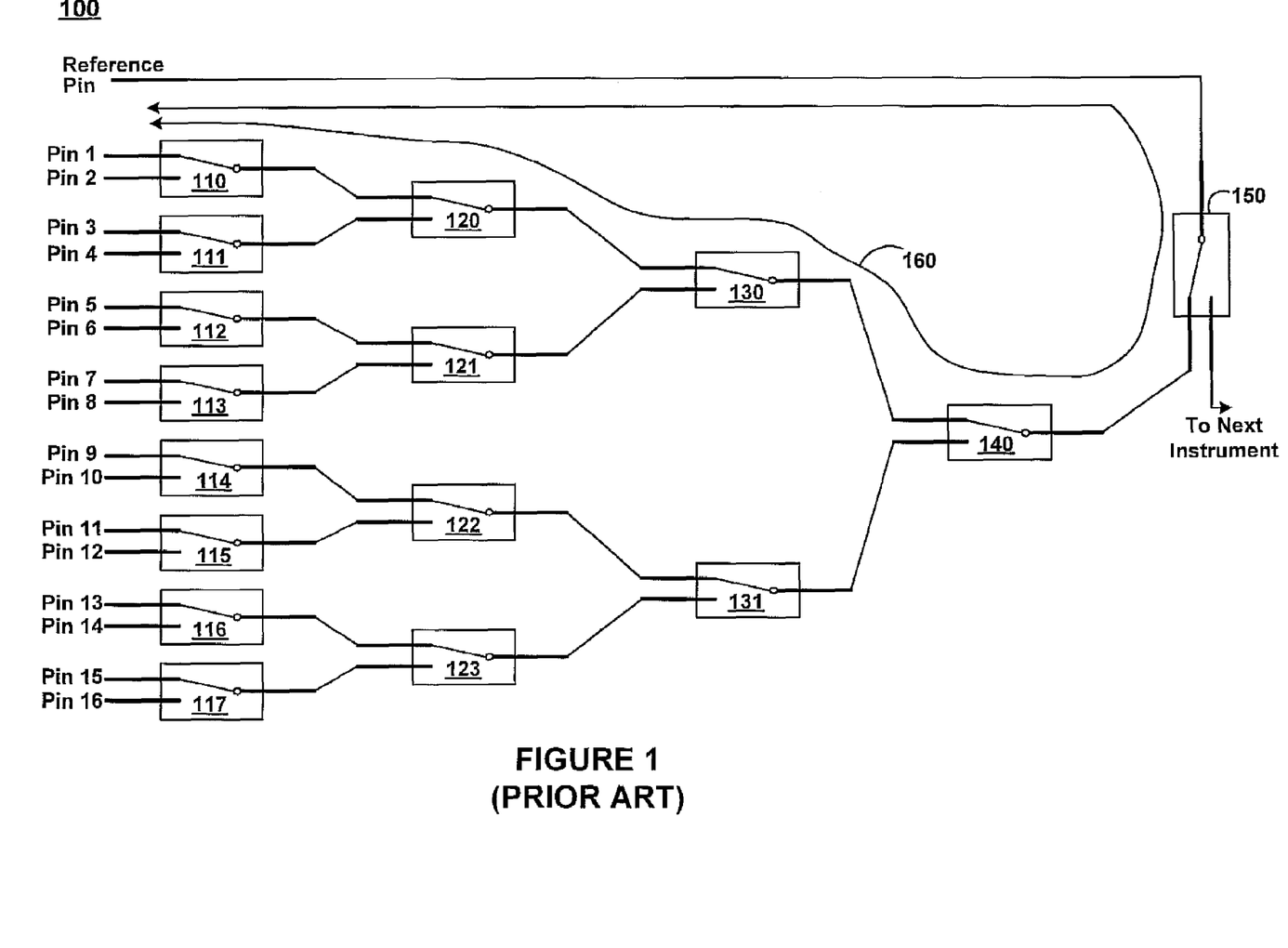
FIG. 1 shows a conventional ATE loadboard for coupling to an instrument.

FIG. 1 shows conventional ATE loadboard 100 for coupling to an instrument. As shown in FIG. 1, loadboard 100 includes a number of relays 110-150 for coupling pins 1 through 16 to the reference pin. The 16 pins couple to a 16 functional pins of an instrument, where each functional pin may be calibrated with respect to one another by adjusting the state of relays 110-150. For example, the state of the relays shown in FIG. 1 enables pin-to-pin calibration of pin 1 with respect to the reference pin by transmitting signals to and from the coupled pins as represented by communication path 160. The states of the relays may then be successively adjusted to couple the other 15 pins to the reference pin for calibration thereto. As such, all the pins may be calibrated to one another by calibrating each pin to the reference pin.

In addition to pin-to-pin calibration, the state of relay 150 may be adjusted to couple the reference pin of one instrument to that of another instrument using a loadboard similar to loadboard 100 for each coupled instrument. By first calibrating respective functional pins to the reference pin of an instrument, functional pins of coupled instruments may be calibrated with respect to one another by calibrating the reference pins of the coupled instruments with respect to one another.

Although loadboards similar to conventional loadboard 100 have been used in the past, the increased signaling speeds used by modern DUTs are beginning to exceed the capabilities of the relays. For example, signal degradation is common when using the relays to gate high-speed signals. Additionally, as the average number of devices tested by ATE increases, the space and power consumption of the relays present fiscal and other logistics issues for ATE manufacturers and users alike. Moreover, as the number of pins of an average DUT increases, the limited loadboard real estate is quickly used up, resulting in component placement which compromises signal integrity and other loadboard functionality.

Furthermore, conventional loadboard 100 requires that each functional pin be calibrated with respect to the reference pin given the inability to directly couple any two functional pins. As such, the need to switch relay state prevents parallel calibration, thereby increasing calibration time and cost. Additionally, calibration measurements of functional pins with respect to the reference pin must be compared to derive calibration data of functional pins with respect to other functional pins. In addition to adding an extra step, such comparison is likely to interject error due to hysteresis, tolerance buildup, or the like.

Thus, not only do relays affect the accuracy and precision of calibration measurements given the inherent signal degradation associated with the relays, but the need to compare measurements with respect to a functional pin exacerbates the problem by interjecting additional error. Furthermore, the decreased accuracy and precision also bring with them increased operation cost, ATE size and signal degradation given the switched nature, large size and power consumption of the relays.

SUMMARY OF THE INVENTION

Accordingly, a need exists for an enhanced loadboard which saves cost and more effectively utilizes loadboard real estate. Additionally, a need exists to decrease signal degradation associated with loadboards when transmitting high-speed signals. Further, a need exists for more direct pin-to-pin calibration which minimizes error interjection when calibrating with respect to a common reference pin. Embodiments of the present invention provide novel solutions to these needs and others as described below.

Embodiments of the present invention are directed towards an enhanced loadboard and method for enhanced automated test equipment (ATE) signaling. More specifically, embodiments provide an effective mechanism for reducing signal degradation and error interjection by replacing one or more relays with signal splitters for directing signals between one or more pins of a coupled ATE instrument, where the signal splitters reduce loadboard size and operating cost.

In one embodiment of the present invention, an enhanced component for conducting an ATE signal includes a first element, and a second and third element coupled to the first element. The first, second and third elements may be pins of the loadboard for coupling to functional pins of an ATE instrument. Alternatively, the elements may be pin electronics of the ATE instrument, or instead other signal splitters or relays of the loadboard. The enhanced component may also include a signal splitter coupled between the first, second and third elements, wherein the signal splitter is operable to conduct the signal from the first element to at least one of the second and third elements. The signal splitter may include a first resistive element coupled to the first element, a second resistive element coupled to the second element, and a third resistive element coupled to the third element. The resistive elements may be resistors, transistors, or the like. Additionally, the first, second and third resistive elements may share a common node.

In another embodiment of the present invention, an enhanced loadboard for use with ATE includes a plurality of elements for coupling to functional pins of an ATE instrument. The loadboard may also include a plurality of relays coupled to the plurality of elements. A plurality of signal splitters may be coupled to the plurality of relays, wherein the signal splitters are operable to conduct ATE signals between the plurality of elements. The signal splitter may include a first resistive element, a second resistive element coupled to the first resistive element, and a third resistive element coupled to the second resistive element. The first, second and third resistive elements may share a common node.

In yet another embodiment of the present invention, a method for enhanced ATE signaling may include transmitting a first signal from a first element of an ATE loadboard to a first resistive element of a signal splitter. The first signal may be split into a second and third signal using a second and third resistive element of the signal splitter. Thereafter, one of the second and third signals may be received using a second element of the ATE loadboard.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 2:
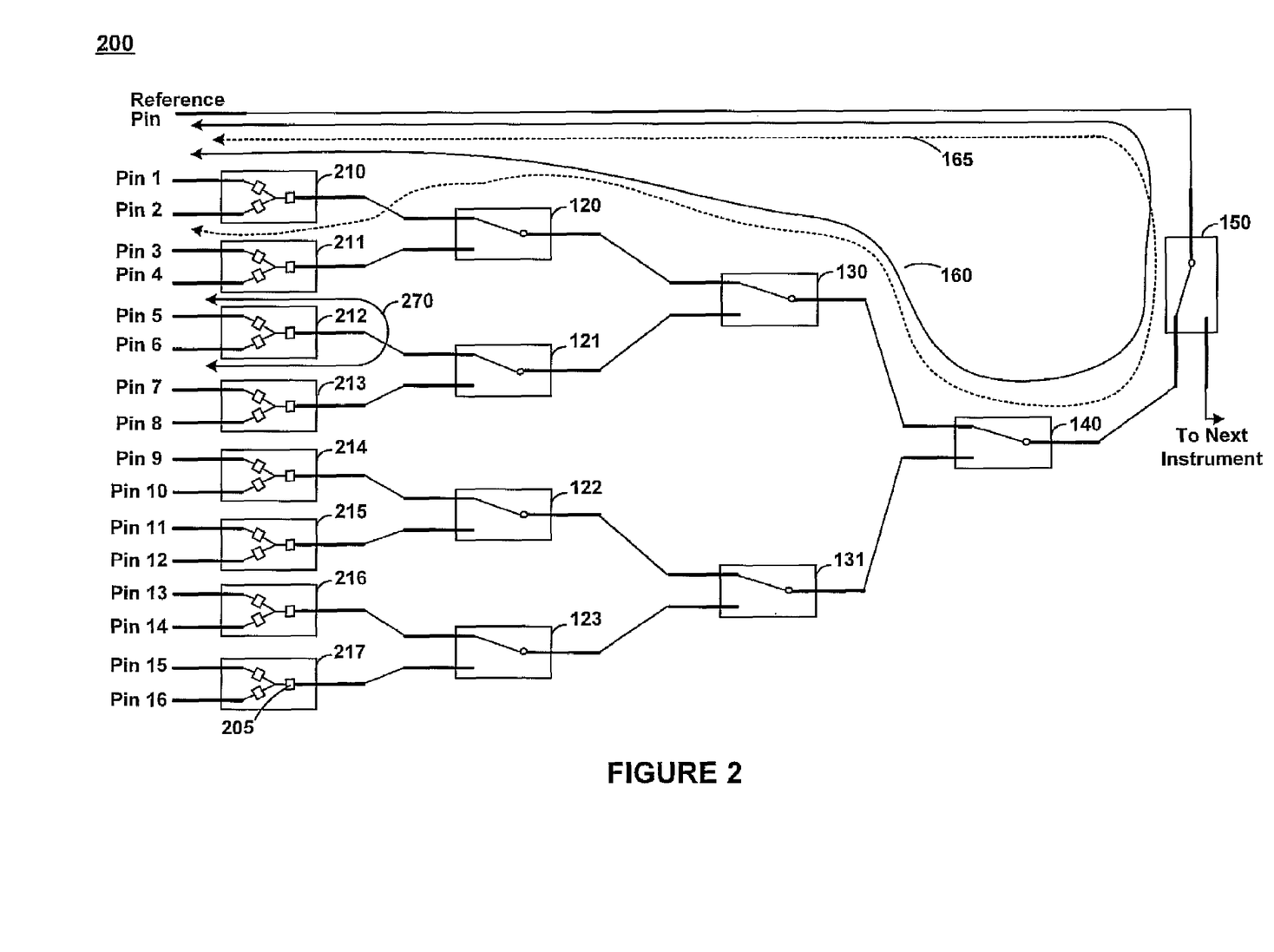
FIG. 2 shows an exemplary ATE loadboard in accordance with one embodiment of the present invention.

FIG. 2 shows exemplary ATE loadboard 200 in accordance with one embodiment of the present invention. As shown in FIG. 2, loadboard 200 comprises a reference pin and pins 1-16 for coupling to an ATE instrument. In addition to relays 120-150, signal splitters 210-217 may be used to couple two or more pins of the loadboard via resistive elements 205. For example, signal splitter 212 may couple pins 5 and 6 to each other to enable signaling through communication path 270, or instead couple pins 5 and/or 6 to the reference pin of loadboard 200 by appropriately adjusting the state of relays 121, 130, 140 and 150. Thus, two or more pins of the coupled instrument may be coupled (e.g., for pin-to-pin calibration, diagnostics, etc.) by coupling the corresponding pins of loadboard 200.

Figure 3:
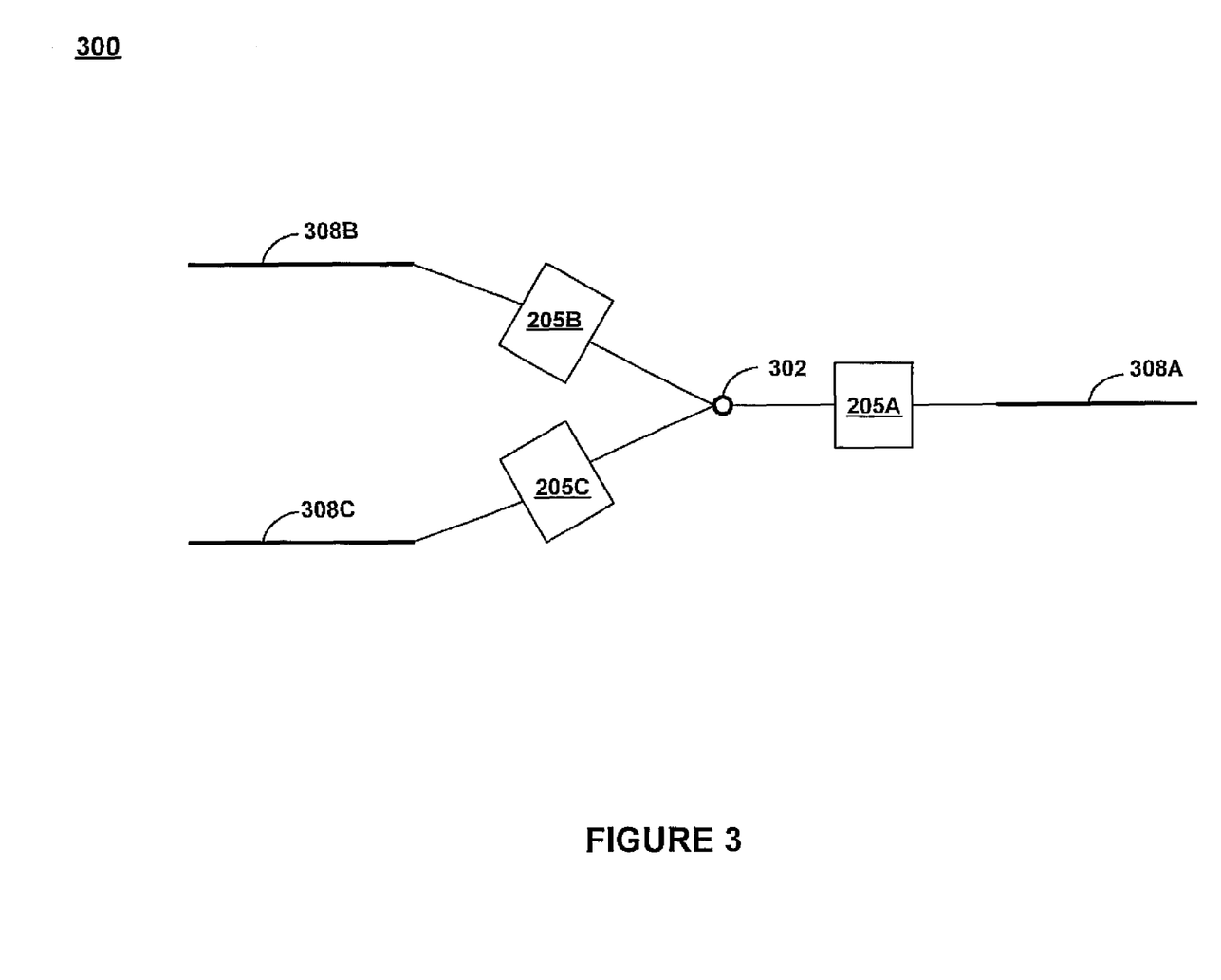
FIG. 3 shows an exemplary signal splitter in accordance with one embodiment of the present invention.

Referring now to FIG. 3, exemplary signal splitter 300 is depicted in accordance with one embodiment of the present invention. Resistive elements 205A, 205B and 205C are shown coupled by common node 302 to provide symmetry to signal splitter 300. As such, a signal may be fed to any leg and split accordingly. For example, a signal fed to the splitter through lead 308A may be split into a second and third signal, where the second signal may exit the splitter through resistive element 205B and the third signal may exit the splitter through resistive element 205C. Alternatively, a signal fed to the splitter through lead 308B may be split into a second and third signal, where the second signal may exit the splitter through resistive element 205A and the third signal may exit the splitter through resistive element 205C. And in another embodiment, a signal fed to the splitter through lead 308C may be split into a second and third signal, where the second signal may exit the splitter through resistive element 205A and the third signal may exit the splitter through resistive element 205B.

In addition to providing symmetric signal flow, signal splitter 300 may also reduce signal degradation by adjusting transmission line properties, where signal degradation may pertain to qualities of the waveform other than signal amplitude (e.g., slew rate, jitter, etc.). For example, where resistive elements 205A, 205B and 205C are resistors, the values of the resistors may be chosen such that impedance mismatch is reduced when sending signals from any resistive element to any other resistive element of the signal splitter. Alternatively, where the resistive elements provide variable resistance (e.g., by using transistors), the values of the resistive elements may be varied (e.g., using a control system to alter transistor bias, etc.) to improve transmission line properties (e.g., on the fly subsequent to manufacturing, etc.). As such, transmission through the signal path may be improved by, for example, reducing reflections caused by impedance mismatch.

Additionally, the configuration of the resistive elements in signal splitter 300 offers a broadband frequency response exceeding that of a relay. As such, signal splitters may pass higher-speed signals with less degradation compared to transmission through a relay. Thus, by removing one or more relays as shown in FIG. 2 and replacing them with signal splitters similar to signal splitter 300, the degradation of signals passed through loadboard 200 is reduced.

Although FIGS. 2 and 3 depict only a two-way signal splitter, the signal splitter may split a signal into three or more resulting signals in other embodiments (e.g., by adding additional resistive elements). Additionally, although leads 308A, 308B and 308C are shown without a corresponding connection, it should be appreciated that the leads may be placed in a termination state (e.g., held at an approximate steady-state potential, ground, etc.) by an element of either the loadboard (e.g., another signal splitter, relay, loadboard pin, etc.) or a coupled instrument (e.g., pin electronics, reference pin, functional pin, etc.) in another embodiment. Additionally, although FIG. 3 shows leads and traces coupling the resistive elements, it should be appreciated that the diagram is merely a block diagram drawn to conveniently depict the connection of the resistive elements. As such, the diagram is not to scale, and in other embodiments the traces and/or leads may be omitted or be alternatively scaled.

As shown in FIG. 3, the resistance value of the resistance elements of signal splitter 300 may be a function of the desired impedance of the signal splitter and the number of times the signal is split. In one embodiment, the resistance value R of each resistance element may be calculated using the following formula:

$$R = \frac{Z(N-1)}{(N+1)}$$

Accordingly, the resistance value R varies as a function of the desired impedance of the signal splitter Z and the number of times the signal is split N. For example, a signal fed through signal splitter 300 is split into two resulting signals (e.g., N=2). As such, if a 50 Ohm impedance is desired for signal splitter 300, the resistance value of each resistance element would be approximately 50/3 Ohms in accordance with one embodiment of the present invention.

Referring back to FIG. 2, signal splitters 210-217 may operate analogously to signal splitter 300 as discussed with respect to FIG. 3 above. As such, a signal fed to one leg of a signal splitter may be split into two or more signals to be received by elements of the loadboard and/or coupled instrument, where one or more of the resistive elements of signal splitter 210 are put in a termination state. For example, a signal transmitted from the reference pin may be sent to pin 1 as shown by communication path 160, or instead to pin 2 as represented by communication path 165. The signal to be split may be directed to signal splitter 210 using relays 150, 140, 130 and 120. Once the signal reaches signal splitter 210, it may be split and fed to pin 1 and/or pin 2. Thus, the relays and signal splitters of loadboard 200 enable calibration (e.g., of pin 1 or pin 2 to the loadboard reference pin) and/or diagnostics operations to be performed on a coupled instrument, where such operations may require unidirectional or bi-directional signaling between pins of the instrument.

Alternatively, signals may be transmitted directly between pins of loadboard 200, which was not possible with the use of a relay. For example, signal splitter 212 enables signaling between pins 5 and 6 as represented by communication path 270, where one or more of the resistive elements of signal splitter 212 may be put in a termination state. As such, direct pin-to-pin calibration (e.g., of pin 5 to pin 6 using 4-way deskew calibration) and/or diagnostics operations may be performed on a coupled instrument without unnecessarily interjecting error (e.g., from calibrating to a separate reference pin, etc.). Additionally, since signal splitters provide symmetric signal flow, it should be appreciated that any signals received by pins other than those in direct communication (e.g., the reference pin when utilizing communication path 270 if relay 130 were adjusted to route a signal from relay 121 to relay 140) may be ignored (e.g., by pin electronics or other components of a coupled instrument, etc.) instead of measured.

In addition to communication between pins of the same instrument, loadboard 200 enables communication between pins of different instruments. For example, if the state of relay 150 is adjusted from the state depicted in FIG. 2, the reference pin of loadboard 200 may be coupled to another loadboard, thereby enabling the coupling of multiple instruments (e.g., where one instrument is coupled to the reference pin and pins 1 through 16, and the other coupled to relay 150). As such, instrument-to-instrument calibration and/or diagnostics may be performed.

As shown in FIG. 2, signal splitters 210-217 comprise resistive elements 205. Since resistive elements (e.g., resistors, transistors, etc.) may be significantly smaller and less expensive than a relay, signal splitters save significant loadboard real estate and cost. Additionally, resistive elements use less power than a relay given the absence of a coil to perform the switching, thereby requiring less energy to power each loadboard. Further, signal splitters offer decreased signal degradation given the ability to remove a switch contact (e.g., within a relay) from the signal path. Moreover, any degradation over time from the switched contact is obviated through the use of a signal splitter since the signal splitter contains no moving parts or mechanical contacts.

Given the ability to receive a split signal at multiple places at the same time, the addition of signal splitters reduces operation time and cost by enabling parallel measurements. For example, a signal directed from the reference pin to signal splitter 212 may feed pins 5 and 6 simultaneously such that pins of a coupled instrument corresponding to pins 5 and 6 may be calibrated in parallel with respect to the reference pin without adjusting the state of a relay. Additionally, diagnostics operations with respect to pins 5 and 6 may also be performed in parallel.

Although FIG. 2 depicts loadboard 200 with a specific number of pins (e.g., 16), it should be appreciated that loadboard 200 may have a larger or smaller number of pins in other embodiments. Additionally, the number of signal splitters and/or relays may vary in other embodiments. Further, the signal splitters and/or relays may be replaced with other signal conduction components in alternative embodiments.

Figure 4:
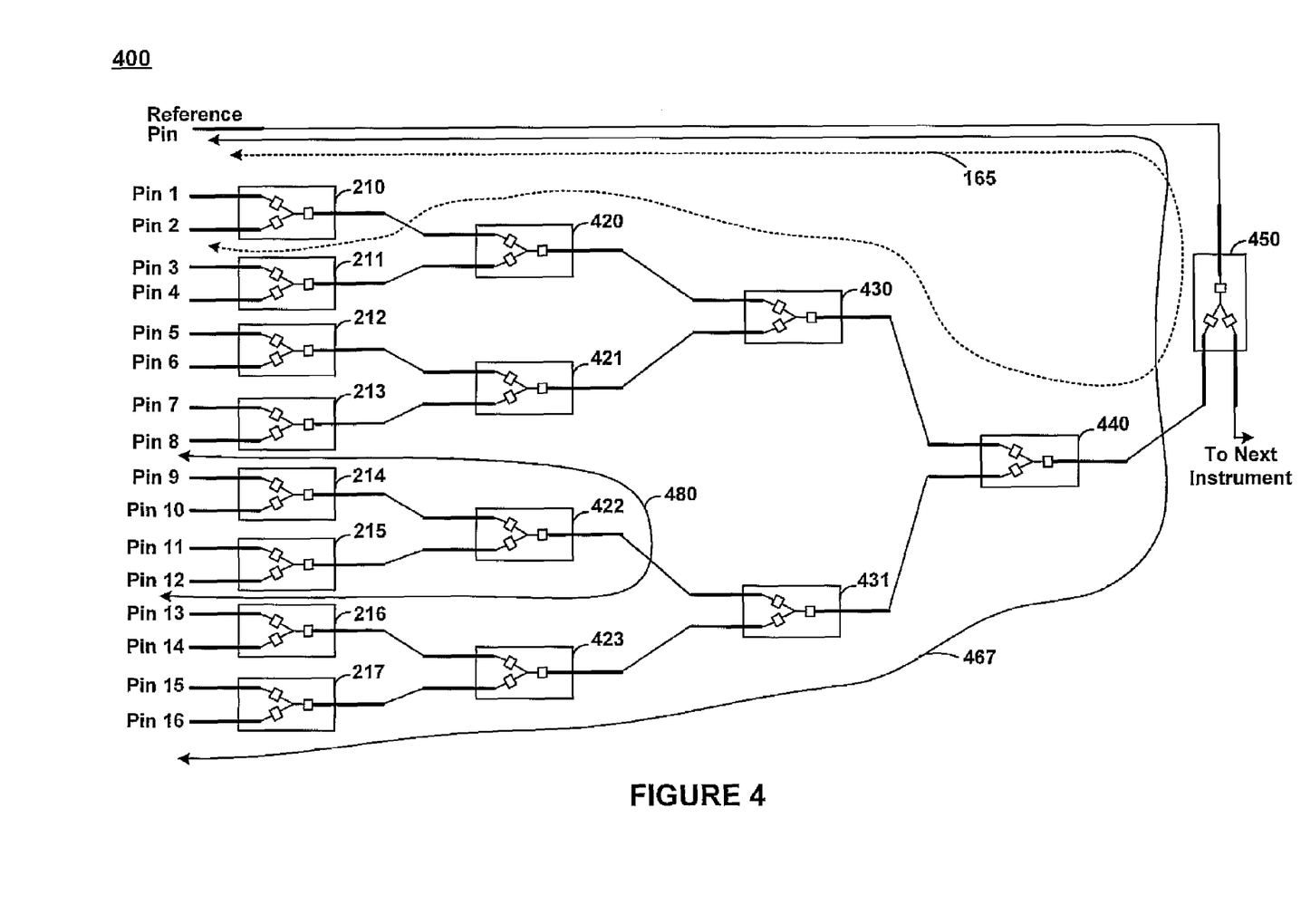
FIG. 4 shows an exemplary ATE loadboard with additional signal splitters in accordance with one embodiment of the present invention.

FIG. 4 shows exemplary ATE loadboard 400 with additional signal splitters in accordance with one embodiment of the present invention. As shown in FIG. 4, loadboard 400 comprises signal splitters 210-217 similar to loadboard 200 shown in FIG. 2. However, relays 120-150 of loadboard 200 are replaced with signal splitters 420-450 in loadboard 400.

As discussed above with respect to FIGS. 2 and 3, signal splitters offer several advantages over relays when used in an ATE loadboard. For example, signal splitters may transmit faster signals with less degradation than relays. Also, a loadboard using signal splitters to replace relays is smaller and costs less to operate than one with more relays. Accordingly, loadboard 400 may reduce the size, operating cost and signal degradation by replacing relays 120-150 with signal splitters 420-450.

Additionally, by increasing the number of signal splitters, loadboard 400 expands the number of pins for which direct pin-to-pin measurements can be taken. For example, signal splitter 422 (in combination with signal splitters 214 and 215) effectively couples pins 9-12, thereby enabling the transmission of signals between any of the coupled pins (e.g., between pins 9 and 12 as represented by communication path 480). Signal degradation associated with the transmission may be reduced by using coupled signal splitters (e.g., 214, 215, 431, etc.) to place the resistive elements 205 of signal splitter 422 in an appropriate termination state (e.g., as discussed above with respect to FIGS. 2 and 3). Thus, direct pin-to-pin calibration (e.g., of pin 9 to pin 12) and/or diagnostics operations may be performed on a coupled instrument without unnecessarily interjecting error (e.g., from calibrating to a separate reference pin, etc.). Additionally, since signal splitters provide symmetric signal flow, it should be appreciated that any signals received by pins other than those in direct communication (e.g., all pins other than pins 9 and 12 when utilizing communication path 480) may be ignored (e.g., by pin electronics or other components of a coupled instrument, etc.) instead of measured.

As shown in FIG. 4, additional signal splitters enable parallel measurements to be taken with respect to a greater number of pins. For example, a signal transmitted from the reference pin of loadboard 400 may be received simultaneously by pin 2 (e.g., as represented by communication path 165) and pin 16 (e.g., as represented by communication path 467). As such, measurements may be taken in parallel without adjusting a relay state to effectively perform pin-to-pin calibration (e.g., using 4-way deskew calibration) and/or diagnostics operations on a coupled instrument. Alternatively, parallel instrument-to-instrument calibration and/or diagnostics operations may be performed on multiple instruments by simultaneously transmitting to pins of each instrument using signal splitter 450.

Although FIG. 4 depicts loadboard 400 with a specific number of pins (e.g., 16), it should be appreciated that loadboard 400 may have a larger or smaller number of pins in other embodiments. Additionally, the number of signal splitters may vary in other embodiments. Further, the signal splitters may be replaced with other signal conduction components in alternative embodiments.

Figure 5:
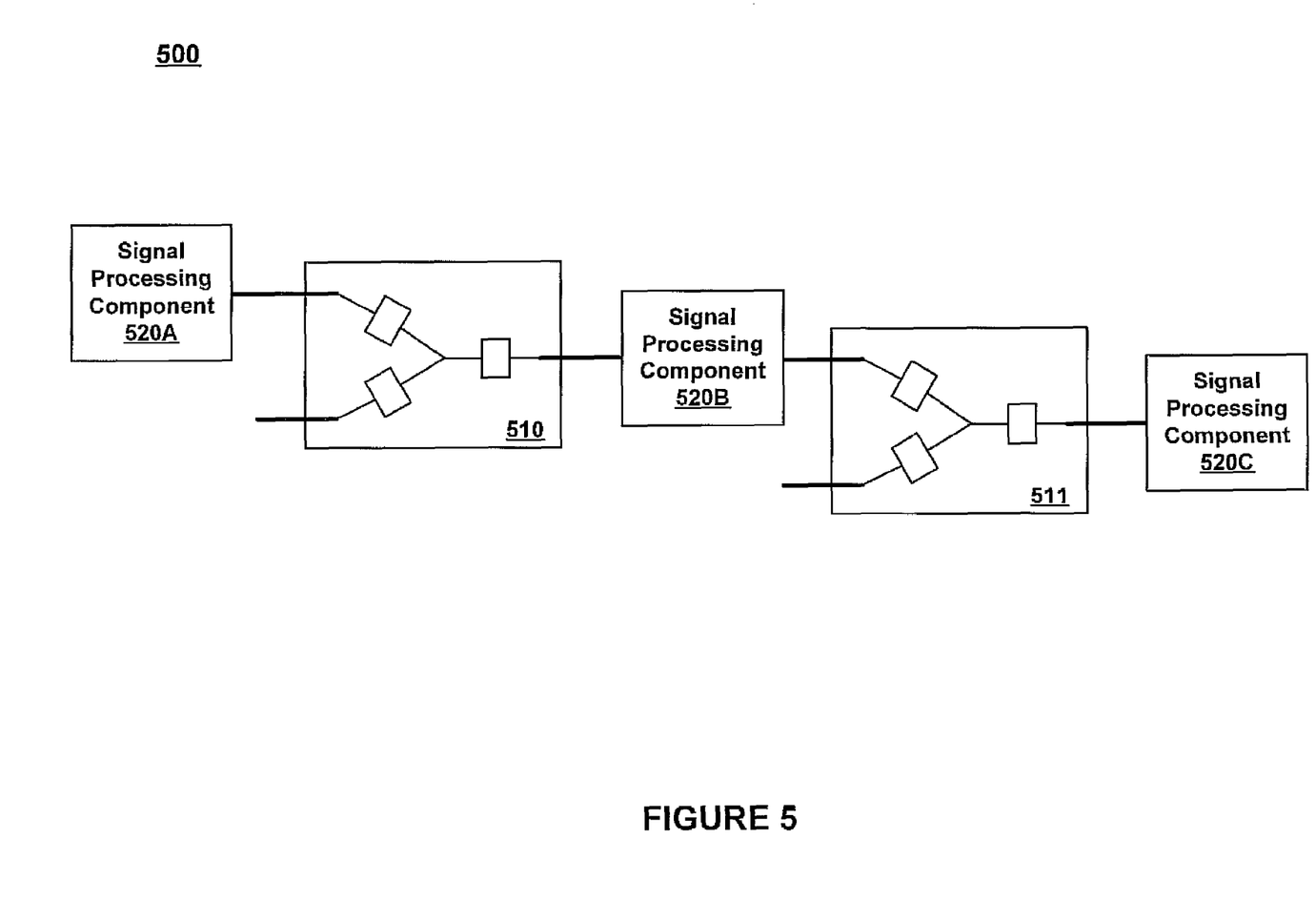
FIG. 5 shows a portion of an exemplary ATE loadboard with at least one signal processing component in accordance with one embodiment of the present invention.

FIG. 5 shows a portion of exemplary ATE loadboard 500 with at least one signal processing component in accordance with one embodiment of the present invention. As shown in FIG. 5, one or more signal processing components (e.g., 520A, 520B and/or 520C) may be coupled to signal splitters 510 and 511 to process signals transmitted through the signal splitters. It should be appreciated that only a single transmission path is depicted in FIG. 5 to simplify the discussion, and that in other embodiments, additional signal splitters and/or signal processing components may be used.

While signal splitters reduce signal degradation (e.g., slew rate, jitter, etc.) compared to transmission through a relay, it should be appreciated that the signal amplitude may be reduced as a result of the split. Also, it should be appreciated that the signal may be influenced by noise and other interference in the environment. As such, signal processing components 520A, 520B and/or 520C may be placed in the signal path to amplify, filter and/or otherwise process the signals to enhance reception and measurement (e.g., to maintain a sufficient signal-to-noise ratio such that detection is possible).

Although FIG. 5 depicts three signal processing components, it should be appreciated that a larger or smaller number may be used in other embodiments. Additionally, the signal processing components may be placed more or less sporadically (e.g., one signal processing component for every two signal splitters, one for every three signal splitters, etc.). Moreover, although the signal processing components are depicted as a portion of loadboard 500, it should be appreciated that one or more signal processing components may be located off the loadboard (e.g., on a separate interface board, within a coupled instrument, etc.).

Figure 6:
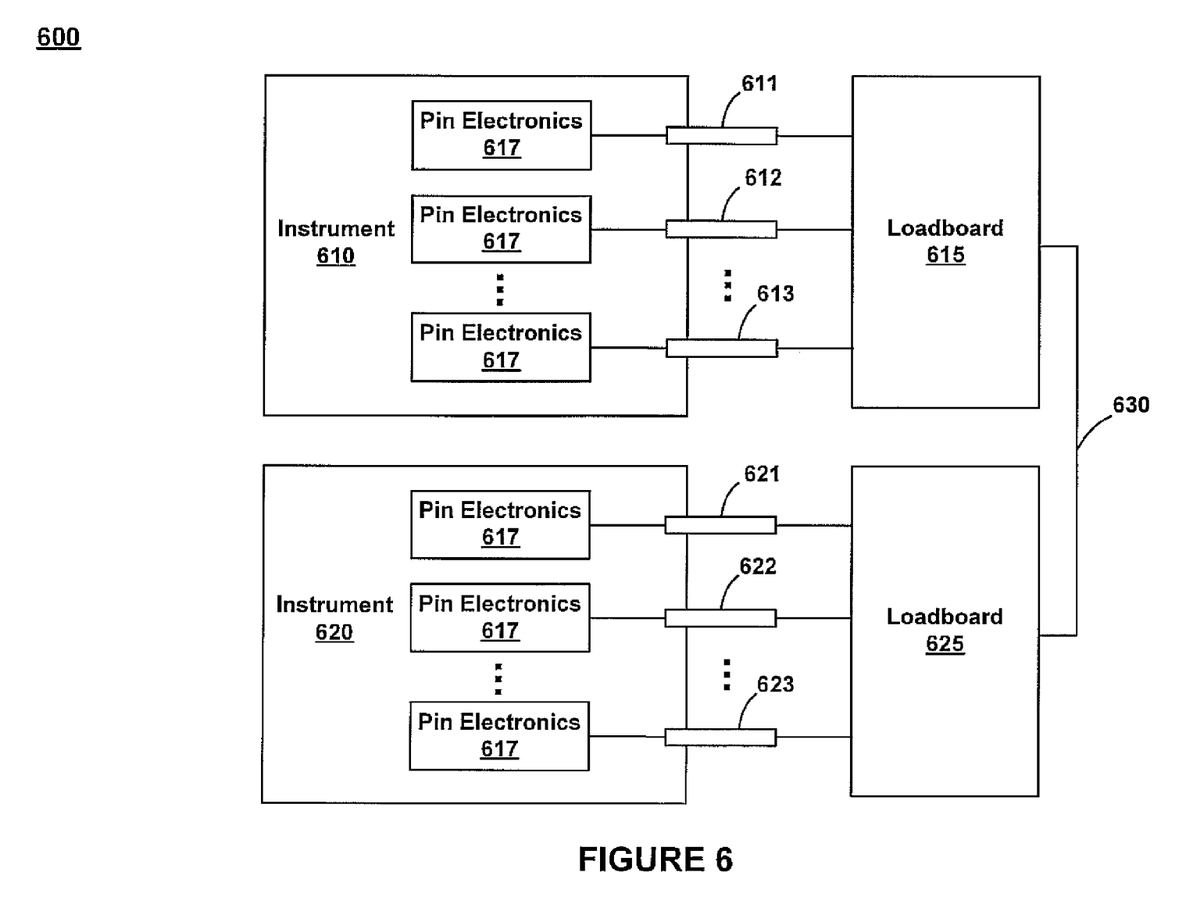
FIG. 6 shows an exemplary ATE system with multiple instruments in accordance with one embodiment of the present invention.

FIG. 6 shows exemplary ATE system 600 with multiple instruments in accordance with one embodiment of the present invention. As shown in FIG. 6, instrument 610 is coupled to loadboard 615, and instrument 620 is coupled to loadboard 625. As such, instruments 610 and 620 may be coupled using interface 630 to couple loadboards 615 and 625.

Instruments 610 and 620 comprise a plurality of pins (e.g., 611-613 and 621-623), which may be a combination of reference, functional and/or calibration pins. The pin electronics components 617 and 627 may couple to the pins for transmitting and receiving signals during diagnostic, calibration and/or test operations. For example, a driver and/or comparator of a pin electronics component may place resistive components of coupled signal splitters (e.g., within loadboards 615 and/or 625) in an appropriate termination state to enable signal transmission through a path with desired transmission line characteristics. Although a single pin electronics component is shown in FIG. 6, it should be appreciated that a single pin electronics component may service more than one pin in other embodiments.

Loadboard 615 couples to the pins 611-613 and may be implemented as discussed above with respect to FIGS. 2, 4 and 5. Similarly, loadboard 625 couples to the pins 621-623 and may be implemented as discussed above with respect to FIGS. 2, 4 and 5. As such, loadboards 615 and 625 may be used to couple the pins of each respective instrument for pin-to-pin calibration and diagnostics procedures as discussed above.

Alternatively, loadboards 615 and 625 may be coupled using interface 630 to perform instrument-to-instrument calibration and/or diagnostics as discussed above. As such, interface 630 may couple to a signal conduction component of the loadboard which effectively couples one or more pins of each instrument. For example, either relay 150 as shown in FIG. 2 or signal splitter 450 as shown in FIG. 4 may couple to interface 630 for coupling instruments 610 and 620.

Figure 7:
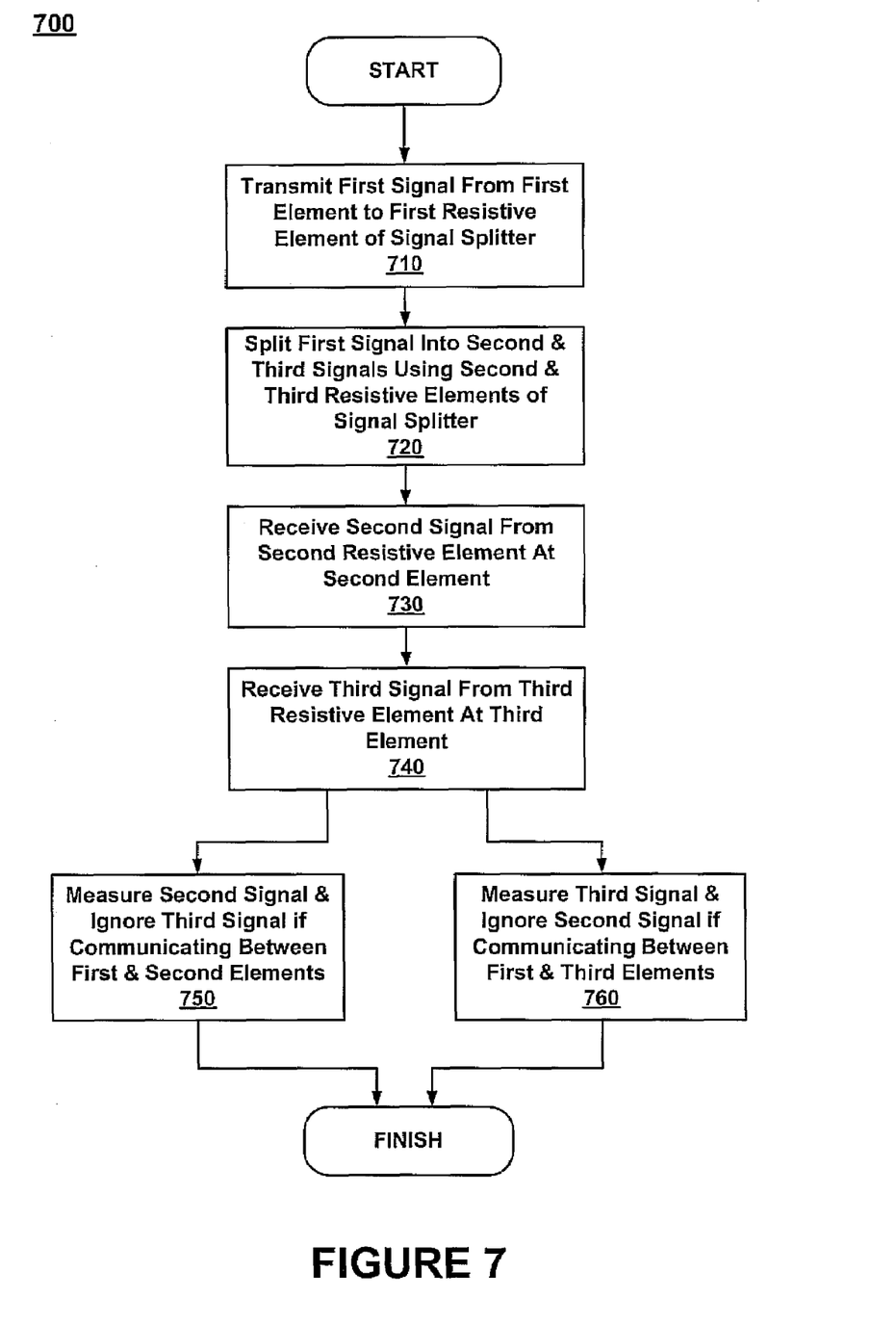
FIG. 7 shows an exemplary process for enhanced ATE signaling in accordance with one embodiment of the present invention.

FIG. 7 shows exemplary process 700 for enhanced ATE signaling in accordance with one embodiment of the present invention. As shown in FIG. 7, step 710 involves transmitting a first signal from a first element to a first resistive element of a signal splitter. The first element may be an element of either the loadboard (e.g., a signal splitter, relay, loadboard pin, etc.) or a coupled instrument (e.g., pin electronics, reference pin, functional pin, etc.). Additionally, the first element may place the first resistive element (e.g., 205A as shown in FIG. 3) in a termination state (e.g., held at an approximate steady-state potential, ground, etc.) to enable the signal splitter to split the signal with reduced signal degradation as discussed above with respect to FIGS. 2 through 6.

After the signal is fed to the first resistive element, the signal may be split into a second and third signal using a second and third resistive element in step 720. The second resistive element (e.g., 205B) and the third resistive element (e.g., 205C) may couple to the first resistive element (e.g., 205A) via a common node (e.g., 302). As such, the resistive elements may effectively split the signal with appropriate impedance matching and other transmission line properties such that the degradation of the resulting second and third signals is reduced. Moreover, it should be appreciated that additional resistive elements may be coupled to further split the first signal, where the resistance value of the resistive elements may then change (e.g., as discussed above with respect to FIG. 3) to adjust the transmission line properties in light of the updated number of split signals.

As shown in FIG. 7, step 730 involves receiving the second signal from the second resistive element at a second element. As discussed above with respect to the first element in step 710, the second element may be an element of the loadboard on which the resistive elements are located. Alternatively, the second element may be an element of a coupled instrument. The second element may place the second resistive element in a termination state as discussed above with respect to FIGS. 2 through 6. Additionally, the second signal may be processed either before or after its receipt in step 730, where the processing may be performed using a signal processing component as discussed above with respect to FIG. 5.

Step 740 involves receiving the third signal from the third resistive element at a third element. As discussed above with respect to the first element in step 710 and the second element in step 730, the third element may be an element of the loadboard on which the resistive elements are located. Alternatively, the third element may be an element of a coupled instrument. The third element may place the third resistive element in a termination state as discussed above with respect to FIGS. 2 through 6. Additionally, the third signal may be processed either before or after its receipt in step 740, where the processing may be performed using a signal processing component as discussed above with respect to FIG. 5.

After receiving the second and third signals in steps 730 and 740, the signals may be either measured and/or ignored in steps 750 and 760. As such, step 750 involves measuring the second signal and ignoring the third signal if communication between the first and second element is desired. As discussed above with respect to FIGS. 2 and 4, the measuring and ignoring may be performed by any component or device coupled to the loadboard (e.g., a pin electronics component of a coupled instrument, some other component of a coupled instrument, etc.), where a separate component or device may perform the measuring and ignoring. Additionally, the second signal may be processed before measurement in step 750, where the processing may be performed using a signal processing component as discussed above with respect to FIG. 5.

Alternatively, if it is desired to communicate between the first and third elements, the third signal may be measured and the second signal may be ignored in step 760. As discussed above with respect to FIGS. 2 and 4, the measuring and ignoring may be performed by any component or device coupled to the loadboard (e.g., a pin electronics component of a coupled instrument, some other component of a coupled instrument, etc.), where a separate component or device may perform the measuring and ignoring. Additionally, the third signal may be processed before measurement in step 760, where the processing may be performed using a signal processing component as discussed above with respect to FIG. 5.

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A component for conducting an automated test equipment (ATE) signal comprising:
   a first element;
   a second element coupled to said first element;
   a third element coupled to said first element; and
   a signal splitter coupled between said first, second and third elements, wherein said signal splitter is operable to conduct said signal from said first element to at least one of said second and third elements, and wherein said signal splitter comprises:
      a first resistive element coupled to said first element;
      a second resistive element coupled to said second element;
      a third resistive element coupled to said third element; and
      wherein said first, second and third resistive elements share a common node.

2. The component of claim 1, wherein said first, second and third resistive elements comprise a plurality of resistors.

3. The component of claim 1, wherein said first, second and third resistive elements comprise a plurality of transistors.

4. The component of claim 1, wherein said signal splitter is symmetrical, and wherein said first, second and third resistive elements comprise substantially equal resistance values.

5. The component of claim 4, wherein said substantially equal resistance values are a function of a predetermined impedance of said signal splitter and a number of times said signal is split.

6. The component of claim 1, wherein at least one of said first, second and third elements couple to a functional pin of an ATE instrument.

7. The component of claim 1 further comprising:
   a signal processing component coupled to said signal splitter and operable to process said signal conducted through said signal splitter.

8. The component of claim 1 further comprising:
   a plurality of relays coupled to said signal splitter and operable to conduct said signal from said first element to at least one of said second and third elements.

9. A loadboard for use with automated test equipment (ATE) comprising:
   a plurality of elements for coupling to functional pins of an ATE instrument;
   a plurality of relays coupled to said plurality of elements; and
   a plurality of signal splitters coupled to said plurality of relays, wherein said signal splitters are operable to conduct ATE signals between said plurality of elements, and wherein said signal splitter comprises:
      a first resistive element;
      a second resistive element coupled to said first resistive element;
      a third resistive element coupled to said second resistive element; and
      wherein said first, second and third resistive elements share a common node.

10. The loadboard of claim 9, wherein said first, second and third resistive elements comprise a plurality of resistors.

11. The loadboard of claim 9, wherein said first, second and third resistive elements comprise a plurality of transistors.

12. The loadboard of claim 9, wherein said signal splitter is substantially symmetrical, and wherein said first, second and third resistive elements have substantially equal resistance values.

13. The loadboard of claim 12, wherein said substantially equal resistance values are a function of a predetermined impedance of said signal splitter and a number of times said a signal is split.

14. The loadboard of claim 9 further comprising:
   a signal processing component coupled to said plurality of signal splitters and operable to process signals conducted through said signal splitter.

15. The loadboard of claim 9, wherein a total number of relays of said loadboard is two less than a number of said plurality of elements.

16. A method for automated test equipment (ATE) signaling, said method comprising:
   transmitting a first signal from a first element of an ATE loadboard to a first resistive element of a signal splitter;
   splitting said first signal into a second and third signal using a second and third resistive element of said signal splitter;
   receiving one of said second and third signals using a second element of said ATE loadboard.

17. The method of claim 16, wherein said first, second and third resistive elements share a common node.

18. The method of claim 16, wherein said first, second and third resistive elements comprise a plurality of resistors.

19. The method of claim 16, wherein said first, second and third resistive elements comprise a plurality of transistors.

20. The method of claim 16, wherein said signal splitter is substantially symmetrical, and wherein said first, second and third resistive elements have substantially equal resistance values.

21. The method of claim 20, wherein said substantially equal resistance values are a function of a desired impedance of said signal splitter and a number of times said a signal is split.

22. The method of claim 16, wherein said second element is a second signal splitter of said ATE loadboard.

23. The method of claim 16, wherein said second element is a relay of said ATE loadboard.

24. The method of claim 16, wherein said second element is a pin electronics component associated with a functional pin of an ATE instrument coupled with said ATE loadboard.

* * * * *